US006734812B2

United States Patent
Lin

(10) Patent No.: US 6,734,812 B2
(45) Date of Patent: May 11, 2004

(54) WIRELESS COMMUNICATION ENCODING AND DECODING TECHNIQUES USING VARIABLE LENGTH CODES

(75) Inventor: Ki-Dar Lin, Taichung Hsien (TW)

(73) Assignee: Elan Microelectronics Corporation, Hsinchu (TW)

( * ) Notice: Subject to any disclaimer, the term of this patent is extended or adjusted under 35 U.S.C. 154(b) by 0 days.

(21) Appl. No.: 10/317,600

(22) Filed: Dec. 12, 2002

(65) Prior Publication Data

US 2003/0141995 A1 Jul. 31, 2003

(30) Foreign Application Priority Data

Jan. 31, 2002 (TW) .................................. 091101606 A

(51) Int. Cl.[7] .............................................. H03M 7/40
(52) U.S. Cl. ...................................... 341/67; 455/455
(58) Field of Search ........................ 341/67, 80; 375/328; 455/455, 461; 398/118

(56) References Cited

U.S. PATENT DOCUMENTS

| | | | |
|---|---|---|---|
| 4,302,845 A | * | 11/1981 | McClaughry et al. ....... 375/328 |
| 4,818,969 A | * | 4/1989 | Krakauer et al. ............. 341/80 |
| 5,903,369 A | * | 5/1999 | Hirayama et al. ........... 398/118 |
| 6,061,569 A | * | 5/2000 | Touzeau et al. ............. 455/455 |
| 6,445,929 B2 | * | 9/2002 | Chandnani et al. ......... 455/461 |

FOREIGN PATENT DOCUMENTS

EP   1 134926 A2   *   9/2001

OTHER PUBLICATIONS

Ran et al. (U.S. application No. 09/755,209), "Method and System for encoding data for transmission Channels", filed on Jan. 5, 2001.*

* cited by examiner

Primary Examiner—Jean Jeanglaude
(74) Attorney, Agent, or Firm—William E. Pelton, Esq.

(57) ABSTRACT

A wireless communication encoding and decoding technique using variable length codes is disclosed. The coding technique defines the transmission time for a high bit in a continuous bit stream as (N×T) expressed in terms of time unit (T), and a low bit as (M×T). By assigning different transmission times to represent high and low bits in continuous bit streams, the total data transmission time can be reduced considerably in handling large amounts of digital data as compared with conventional coding techniques. Other advantages using this coding technique include power saving by the data communication device, which may be a battery-powered peripheral device or mobile unit, and more reliable signal synchronization at both ends of the communication link.

6 Claims, 6 Drawing Sheets

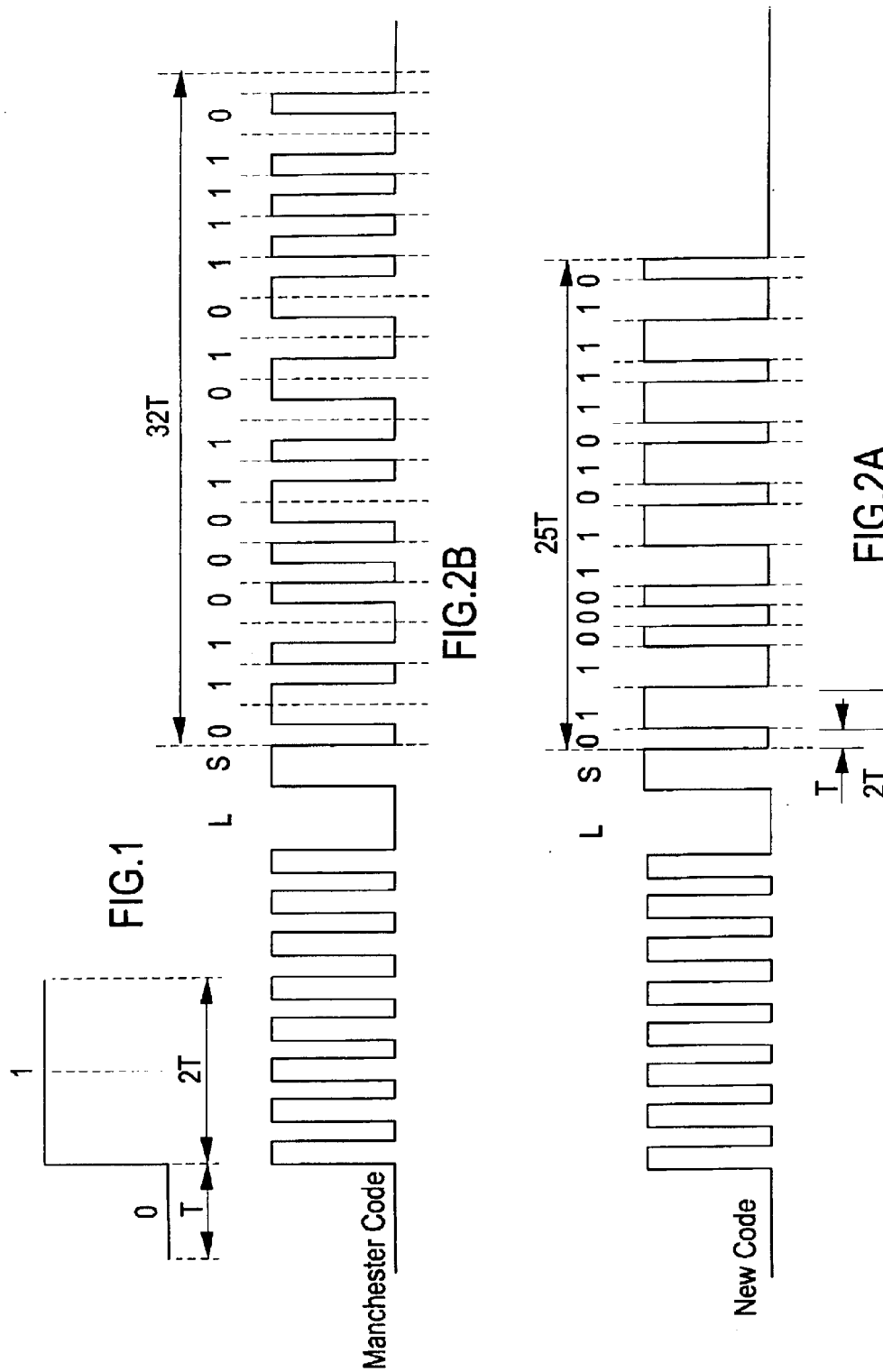

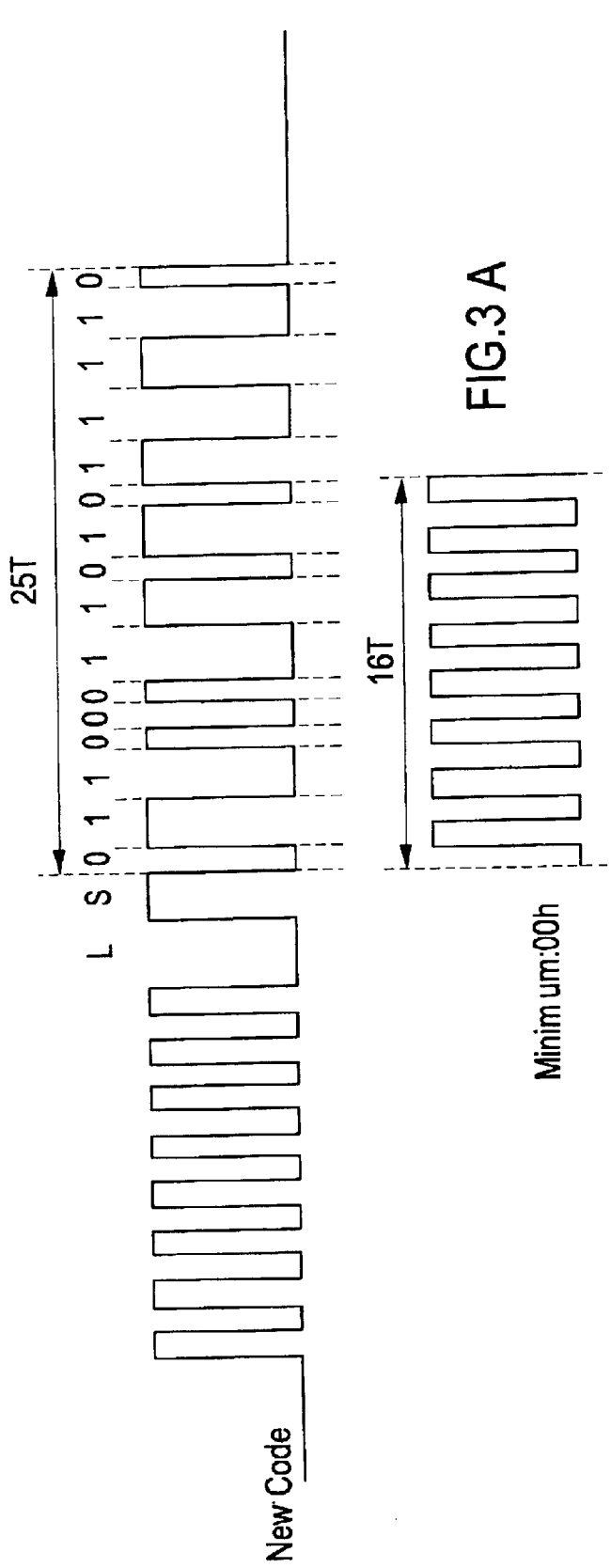
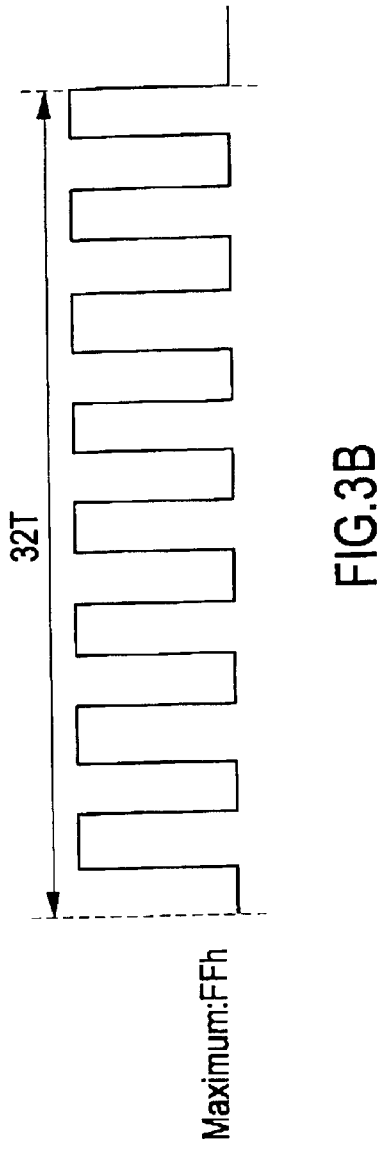
FIG.3A
FIG.3B

WIRELESS COMMUNICATION ENCODING AND DECODING TECHNIQUES USING VARIABLE LENGTH CODES

BACKGROUND OF THE INVENTION

1. Field of the Invention

The present invention relates to wireless communication encoding and decoding techniques using variable length codes, in particular to signal encoding and decoding techniques that assign different transmission times for high and low bits in the transmitted data, enabling considerable reduction in total transmission time and power saving by the data communication device.

2. Description of Related Arts

In wireless communication, data streams to be transmitted are encoded at the transmitting end, modulated into analogous waveform, and then transmitted in the form of radio frequencies or infrared beams. At the receiving end, the analogous signals are received, amplified, demodulated to digital form, and then decoded to restore the original data format.

In wireless communication, the primary objective of various coding technique is to minimize the data transmission time, and maintain signal synchronization at both ends to ensure reliable data transmission.

The wireless communication encoding and decoding techniques not only change the transmission time but also affect the power status of the data communication device. Commonly used wireless computer peripherals such as a keyboard and a mouse are connected by wireless means to maintain bidirectional communication with the host computer. Since these devices are powered by a battery, the longer it takes to transmit a data stream, the battery operation hours of the transmitting device will be further decreased. Therefore, the choice of a signal coding technique indirectly affects their power consumption and the operation time of the device.

Generally, data are transmitted in basic units called packets. Each packet is divided up into multiple segments each serving a special function in the data transmission process. A standard packet contains a preamble, a header, a control segment, a data segment, and an SFT segment, as shown in FIG. 6. Some of the more commonly used coding patterns for the data segment as shown in FIG. 7 are listed hereunder:

Non return to zero (NRL)-L coding: according to this technique, a high bit "1" in the data is represented by positive voltage (+V), whereas a low bit "0" is represented by negative voltage (−V).

NRZ-M coding: according to this technique, only when the bit value in a continuous bit stream changes from "0" to "1", the voltage of the output signal is changed from the positive voltage (+V) to negative voltage (−V), whilst the voltage remains in the positive (+V) for all other bit conditions.

Unipolar return to zero (RZ): according to this technique, for every high bit "1" in the bit stream the output signal experiences one transition from negative voltage to positive voltage, and the voltage for low bit "0" is at the negative.

Manchester: according to this encoding and decoding technique, the signal changes once in each time unit regardless of the status of the data bit. The rising edge of the signal represents a high bit "0", whilst the falling edge represents a low bit "1".

Delay modulation: according to this technique, the voltage of the output signal experiences one transition in a time unit for the occurrence of each high bit "1" in the bit stream, by delaying the voltage transition from the preceding bit for one time unit before changing the voltage. For a low bit "0", the voltage of the output signal is unchanged from the previous time unit, and for two successive low bits "0", the signal voltage for the second low bit "0" is the inverse of the voltage for the previous bit.

In actual operation using the first three signal coding techniques the signal output does not necessarily experience voltage change in each time unit, making it more difficult to maintain signal synchronization at both ends. These techniques thereby are seldom employed in synchronous communication. The Manchester coding having the characteristics of voltage transition in each time unit naturally is better for synchronous transmission with wireless means. However, in the Manchester coding every bit of information is assigned the same length of time, that means a fixed length code is used in the transmission data. The difference in transmission time between a variable length code and a fixed length code is cumulative for larger amounts of transmission data, resulting in much longer transmission time than that using variable length codes.

For example, as shown in FIG. 8, using the Manchester coding technique, the bit stream 01100011_01011110 represents two data bytes (2 bytes=16 bits). The encoded signals at the transmitting end show that every bit in these two bytes is occupied by the same number of time units (2T in this embodiment), thus the total transmission time for these two bytes is 16×2T=32T. Longer transmission time using the Manchester coding also consumes more electric power in the data communication process.

The present invention is to address the above mentioned problem with variable length codes.

SUMMARY OF THE INVENTION

The main object of the present invention is to provide wireless communication encoding and decoding techniques using variable length codes, wherein a low bit "0" and a high bit "1" in the data stream are differentiated by different transmission time, thus enabling reduction in the total transmission time and power saving by the data communication device.

The second object of the invention is to provide wireless communication encoding and decoding techniques using variable length codes, wherein every bit of transmitted data is accompanied by a voltage transition in the output signal, and the signal synchronization at both ends of the communication link ensures high reliability in data transmission.

The wireless communication encoding and decoding techniques using the variable length codes comprise the steps of:

defining a time unit (T);

defining the number of time units (N) to be assigned for representing the high bit "1", for example 2T; and defining the number of time units (M) to be assigned for representing the low bit "0", for example 1T;

wherein two adjacent data bits are to be represented by different voltages in the signal output.

The features and structure of the present invention will be more clearly understood when taken in conjunction with the accompanying figures.

BRIEF DESCRIPTION OF THE DRAWINGS

FIG. 1 is a signal coding method for high and low bits according to the new coding technique proposed by the present invention;

FIGS. 2A, 2B is a comparison between the conventional Manchester coding pattern and the new coding pattern proposed by the present invention;

FIGS. 3A, 3B are the new code representation of the bit stream 01100011_01011110, code with minimum length (00h), and code with maximum length (FFh);

DETAILED DESCRIPTION OF THE PREFERRED EMBODIMENT

The present invention provides a new coding technique by assigning different transmission time units (T) to represent low bit "0" and the high bit "1" respectively. The coding method shown in FIG. 1 is practiced by one embodiment of the present invention in which a low bit "0" is assigned one time unit (T) of transmission time, whereas a high bit "1" is assigned two time units (2T) of transmission time, and two adjacent data bits are represented by different voltages, that is voltage changes either from positive to negative, or vice versa.

FIG. 2 shows a comparison between the conventional Manchester coding pattern and the new coding pattern proposed by the present invention. The bit stream to be transmitted is "01100011_001011110", where the low bit "0" is represented by one time unit (T), and the high bit "1" by two time units (2T), and the total transmission time used by the above bit stream is 25T; however, the transmission time using Manchester coding takes 32T. The difference in transmission time is attributed to the fact that in the Manchester coding every data bit requires two time units (2T) in transmission, whereas the new coding technique only uses one time unit for the low bit and two time units for the high bit. Therefore the new coding technique proposed by the present invention using variable length codes enables reduction in transmission time over the long term.

Referencing FIG. 3, if the transmitted data value is 00h (the hexadecimal representation for data value "0"), the transmission time can be finished in 16T time with the new coding technique. For data value FFh (the hexadecimal representation for data value "1"), then the transmission time used is longest with 32T, which is the same as the transmission time for conventional signal coding technique. However, the average transmission time can be reduced by 25% for a bit stream containing unspecified number of low bits and high bits.

In actual practice, the new coding pattern enables even more flexibility in the data transmission. For example, a low bit "0" can be represented by 2T, and a high bit "1" by 1T.

Figure 4:
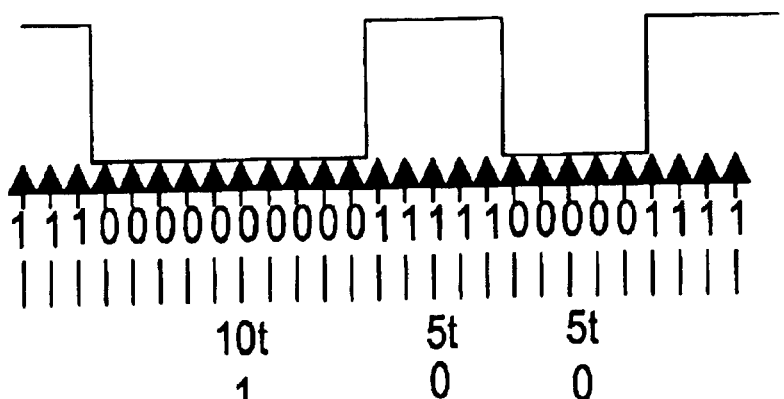
FIGS. 4A~C show the decoding method used in cyclical sampling with noise suppression.
Figure 4:
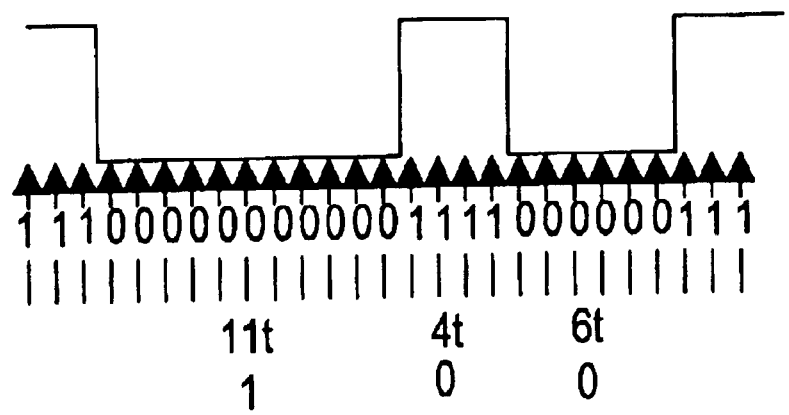
Figure 4:
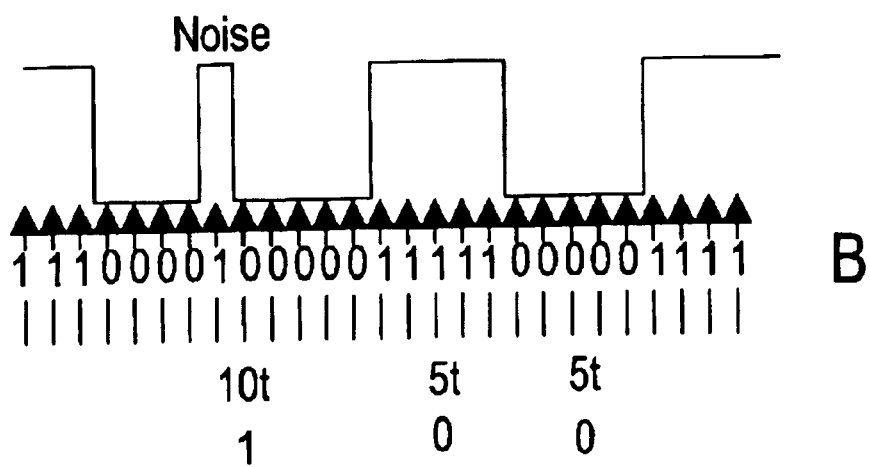

The decoding operation at the receiving end is based on a cyclical sampling technique, which has incorporated a certain tolerance range for possible discrepancies. As shown in FIG. 4A, if the bit value "0" is defined to be 5t, and the bit value "1" is to be 10t, where t represents a unit of time required for performing a complete sampling cycle, a suitable tolerance value can be set up in defining the data frame for signal reception. For example, a signal in the range 8t~12t represents bit value "1", and a signal in the range of 3t~7t to represent a bit value "0". During data reception as shown in FIG. 4B, the data value still can be correctly identified using the new signal coding technique. If any noise is present in the transmitted data as shown in FIG. 4C, they can be filtered out from the incoming signals because noise only remains for one time unit (t) or less.

Figure 5:
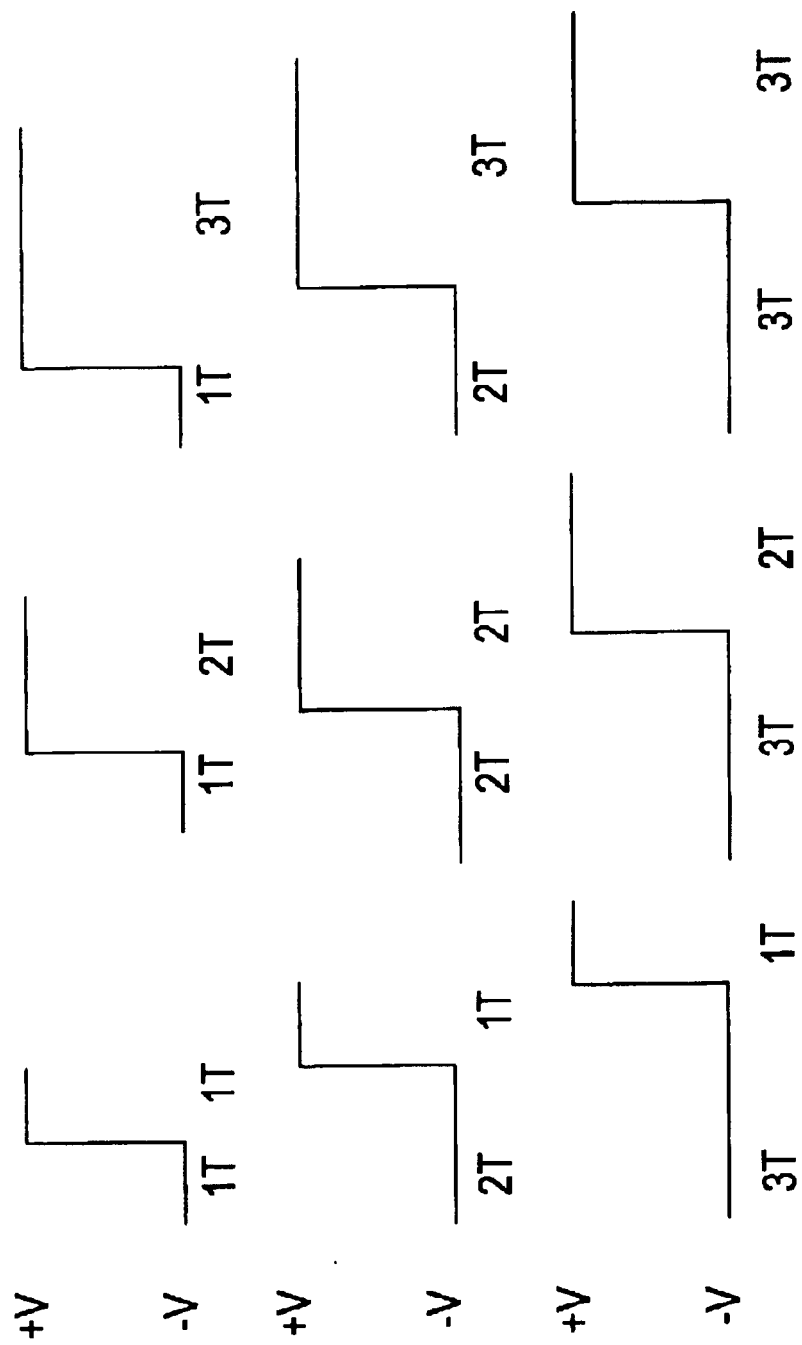
FIG. 5 shows all the possible codes according to the new coding technique.
Figure 6:
FIG. 6 shows the various segments of a data packet.
Figure 7:
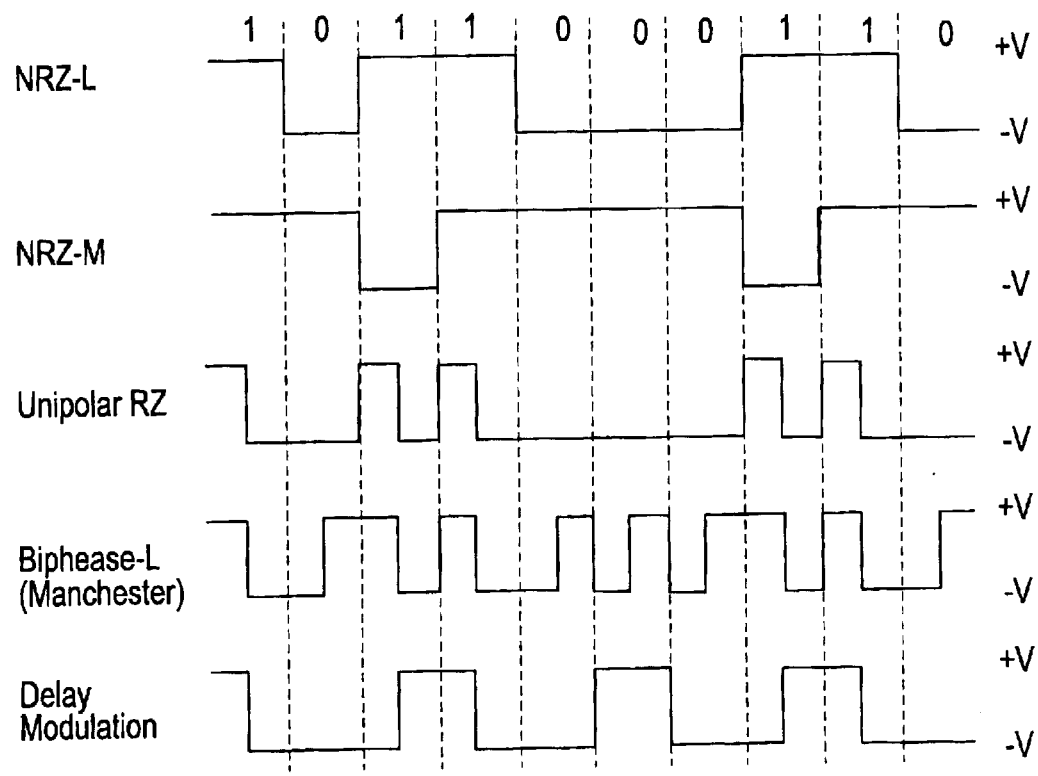
FIG. 7 is a comparison for several commonly used coding patterns.
Figure 8:
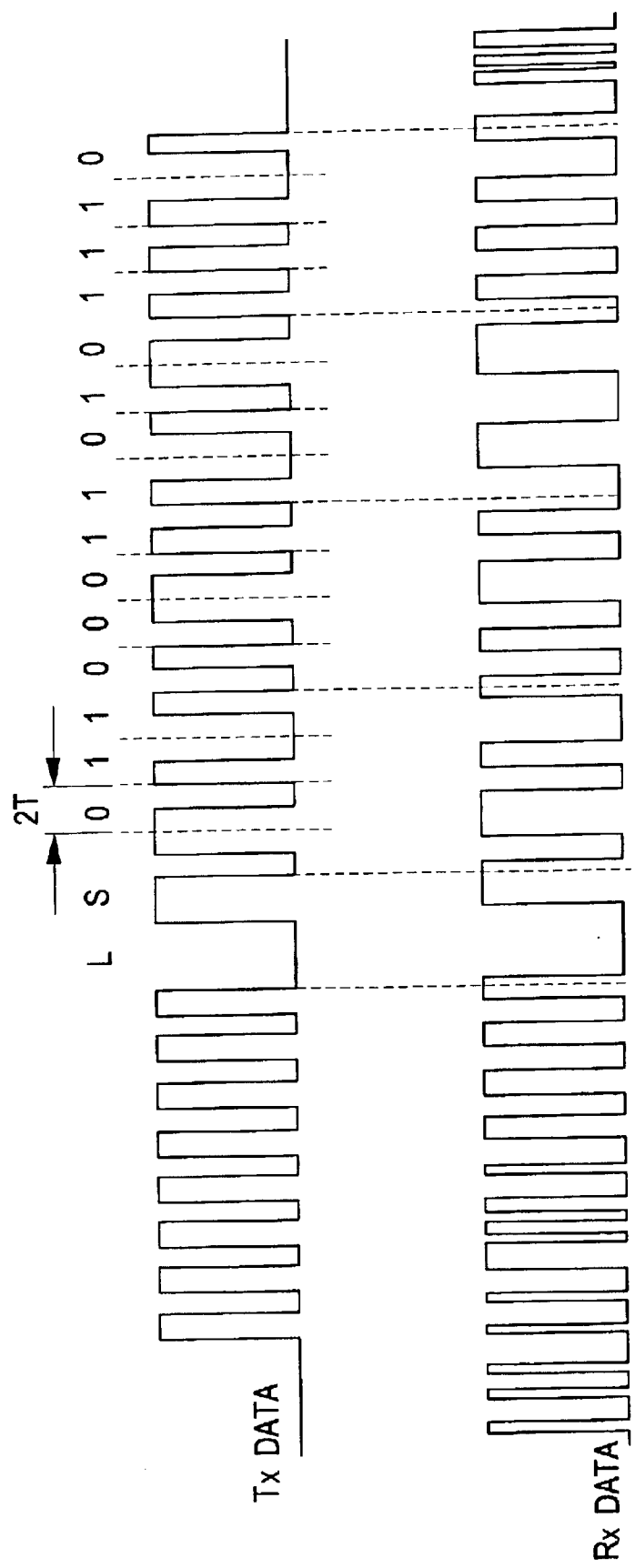
FIG. 8 shows the bit shifting after transmitting the bit stream "01100011_01011110" using the Manchester coding technique.

FIG. 5 shows all the possible codes according to the new signal coding technique, wherein different transmission times are assigned for bit values "0" and "1", and by further incorporation of different voltage levels, a code table can be created to include all unique data patterns. There are a total of nine coding patterns as shown in FIG. 5 to represent nine different types of data streams.

The new signal coding technique is more advantageous in that:

(1) Reduction of total transmission time: by using a coding scheme with different time units to represent bit values "0" and "1" respectively;

(2) Power saving: the power for the data communication device can be saved in proportion to the reduction in transmission time;

(3) Trouble-free signal synchronization: simple synchronization for the transmitting and receiving ends, thus leading to improved stability and reliability in data transmission.

The foregoing description of the preferred embodiments of the present invention is intended to be illustrative only and, under no circumstances, should the scope of the present invention be so restricted.

What is claimed is:

1. A wireless communication encoding technique using variable length bits, comprising:

defining a transmission time unit in terms of (T);

defining a bit "1" using N time units to be (N×T);

defining a bit "0" using M time units to be (M×T);

wherein the values of M and N are unequal, and two adjacent data bits are represented by different voltages in output signal.

2. The wireless communication encoding technique using variable length bits as claimed in claim 1, wherein the time value N is greater than M.

3. The wireless communication encoding technique using variable length bits as claimed in claim 1, wherein the time value N is less than M.

4. A wireless communication decoding technique using variable length bits, comprising:

defining a basic time unit in terms of (T);

defining a bit "0" using N time units to be (N×T);

defining a bit "1" using M time units to be (M×T);

wherein the values of M and N are unequal.

5. The wireless communication decoding technique using variable length bits as claimed in claim 4, wherein the time value N is greater than M.

6. The wireless communication decoding technique using variable length bits as claimed in claim 4, wherein the time value N is less than M.

* * * * *